United States Patent
Ravanelli

(10) Patent No.: US 6,248,639 B1
(45) Date of Patent: Jun. 19, 2001

(54) ELECTROSTATIC DISCHARGE PROTECTION CIRCUIT AND TRANSISTOR

(75) Inventor: Enrico M. A. Ravanelli, Monza (IT)

(73) Assignee: SGS-Thomson Microelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/290,037

(22) Filed: Apr. 9, 1999

Related U.S. Application Data

(62) Division of application No. 08/963,192, filed on Nov. 3, 1997, now Pat. No. 5,936,284.

(51) Int. Cl.$^7$ .................................................. H01L 21/331
(52) U.S. Cl. ........................ 438/335; 438/312; 438/337; 438/350; 438/524
(58) Field of Search ................................. 438/524, 527, 438/312, 314, 335, 337, 338, 342, 235, 309, 350

(56) References Cited

U.S. PATENT DOCUMENTS

| 4,735,912 | * | 4/1988 | Kawakatsu ........................... 438/362 |
| 4,989,057 | | 1/1991 | Lu . |
| 4,994,874 | | 2/1991 | Shimizu et al. . |
| 5,181,092 | | 1/1993 | Atsumi . |
| 5,304,839 | | 4/1994 | Chen et al. . |
| 5,369,298 | | 11/1994 | Honda et al. . |
| 5,371,395 | | 12/1994 | Hawkins . |
| 5,450,267 | | 9/1995 | Diaz et al. . |
| 5,463,520 | | 10/1995 | Nelson . |
| 5,477,414 | | 12/1995 | Li et al. . |
| 5,501,992 | | 3/1996 | Nakamura . |
| 5,532,896 | | 7/1996 | Coussens et al. . |
| 5,532,901 | | 7/1996 | Hawkins et al. . |
| 5,548,134 | | 8/1996 | Tailliet . |
| 5,623,387 | | 4/1997 | Li et al. . |
| 5,675,168 | | 10/1997 | Yamashita et al. . |
| 5,684,321 | | 11/1997 | Okamura . |
| 5,736,755 | | 4/1998 | Fruth et al. . |
| 5,895,249 | * | 4/1999 | Zambrano et al. ................... 438/356 |
| 6,121,089 | * | 9/2000 | Zeng et al. ............................ 438/268 |

* cited by examiner

*Primary Examiner*—Stephen D. Meier
*Assistant Examiner*—Jamie L. Brophy
(74) *Attorney, Agent, or Firm*—Theodore E. Galanthay; Allen, Dyer, Doppelt, Milbrath & Gilcrest, P.A.

(57) ABSTRACT

A circuit protects against electrostatic discharge and includes a pad which receives an external signal source. The transistor of the present invention is connected to the circuit to be protected and includes a semiconductor body of a first conductivity type and serves as the collector of the transistor and is connected to the pad. A first doped region of a second conductivity type is contained in the semiconductor body and serves as the base of the transistor and forms a collector-to-base junction surface with the semiconductor body. A second doped region of the first conductivity type is contained in the first doped region and serves as the emitter of the transistor and forms a base-to-emitter junction surface with the first doped region. The first and second doped regions are electrically connected for establishing a shorted connection between the base and emitter. The first doped region includes a generally H-shaped doped region and a generally ring-shaped doped region forming an opening in which the second doped region serving as the emitter is received. The H-shaped doped region has a deeper junction surface than the junction surface of the ring-shaped doped region, and a dopant concentration that is less than the dopant concentration of the ring-shaped doped region. The H-shaped doped region achieves a low collector-to-base breakdown voltage and the ring-shaped doped region achieves a low snap-back voltage. A method for forming the transistor is also disclosed.

16 Claims, 3 Drawing Sheets

ELECTROSTATIC DISCHARGE PROTECTION CIRCUIT AND TRANSISTOR

This application is a division of Ser. No. 08/963,192 filed on Nov. 3, 1997, now U.S. Pat. No. 5,936,284 the disclosure of which is hereby incorporated by reference in its entirety.

FIELD OF THE INVENTION

This invention relates to protecting semiconductor circuits against electrostatic discharge, and more particularly, to a protection circuit having a transistor used for protecting semiconductor circuits against electrostatic discharge.

BACKGROUND OF THE INVENTION

Semiconductor integrated circuits are prone to electrostatic breakdown by static electricity charged on the human body or other similar sources. Such electrostatic discharge (ESD) causes breakdown of the PN junction surface and breakdown of various films and layers formed on the device such as oxide films.

Various techniques have been devised for protecting circuits against damage caused by electrostatic discharge, such as those generated from the human body. These circuits have become very important because the slightest handling by an individual during semiconductor processing or in a final product could create enough electrostatic discharge to break down an oxide film or PN junction, thus ruining the semiconductor device.

Some ESD protection devices and circuits use a combination of diodes and resistors to protect the semiconductor circuits. Other ESD protection circuits use various types of transistors, such as disclosed in U.S. Pat. No. 4,989,057 to Lu, which discloses a floating body field effect transistor having a defined breakdown voltage, and a lower holding voltage to serve as a clamp for electrostatic discharge voltages, minimizing thermal power dissipation within the semiconductor layer.

U.S. Pat. No. 5,623,387 to Li, et al., uses a split bipolar transistor with the transistor layout exhibiting very high tolerance to ESD events. The split bipolar transistor divides current among many segments and prevents current hogging, causing an ESD failure. The transistor uses the snap-back effect to increase current carrying capacity. The transistor layout has metal contacts that are positioned away from regions of high energy dissipation. The use of high-diffusing phosphorous in various N-type doped regions prevents sharp changes in electron density.

Other circuits do not use as many contacts and doped regions, but make use of a transistor with the emitter and base shorted to show a bistable behavior having a high impedance in the avalanche breakdown region and a low impedance in the bipolar snap-back region.

In such transistor devices, it is desirable to increase the clamping efficiency (i.e., limiting the voltage at a point in a circuit) by limiting the maximum voltage developed at the collector terminal. It is also desirable to have the smallest snap-back voltage to increase the device failure threshold during electrostatic discharge conditions.

These two requirements are typically mutually exclusive because a low collector-to-base breakdown voltage requires a generally low base dopant level, while a low clamping voltage during snap-back operation requires a high current gain and a generally high base dopant level.

SUMMARY OF THE INVENTION

It is therefore an object of the present invention to provide a circuit for protecting against electrostatic discharge by increasing the clamping efficiency of protection and reducing the snap-back voltage.

It is also an object of the present invention to provide a transistor used in a circuit for protecting against electrostatic discharge that achieves a low collector-to-base breakdown voltage and a low clamping voltage during snap-back operation.

The circuit of the present invention now protects against electrostatic discharge by using a transistor having a base with two doped regions giving a unique configuration so that one doped region achieves a low collector-to-base breakdown voltage and the other doped region achieves a low snap-back voltage. The circuit includes a pad, which receives a signal from an external signal source, such as a power source or other signal. A semiconductor body of a first conductivity type serves as the collector of the transistor and is connected to the pad. A first doped region of a second conductivity type is contained in the semiconductor body and serves as the base of the transistor and forms a collector-to-base junction with the semiconductor body. A second doped region of the first conductivity type is contained in the first doped region and serves as the emitter of the transistor and forms a base-to-emitter junction with the first doped region.

Connection means electrically connects the first and second doped regions and establishes a circuit connection between the base and emitter. The first doped region serving as the base further comprises a generally H-shaped region and a generally ring-shaped doped region forming an opening in which the second doped region serving as the emitter is received. The H-shaped doped region has a deeper junction depth than the ring-shaped doped region and a dopant concentration that is less than the dopant concentration of the ring-shaped doped region so that the H-shaped doped region achieves a low collector-to-base breakdown voltage and the ring-shaped doped region achieves a low snap-back voltage.

In one aspect of the present invention, the H-shaped doped region further comprises means for receiving and substantially encircling the ring-shaped doped region. The receiving means defines a ring-shaped recess that receives the ring-shaped doped region. The H-shaped doped region further comprises an inward formed medial section that exposes a portion of said ring-shaped doped region to the semiconductor body serving as a collector. The opening in the ring-shaped doped region exposes a portion of the H-shaped doped region to the second doped region of first conductivity serving as the emitter. The H-shaped doped region further comprises a central slot and includes a doped region of second conductivity received in the central slot and engaging the shorted connection means.

In still another aspect of the present invention, the shorted connection means comprises a contact engaging both first and second doped regions serving as the base and emitter. The shorted connection means can also include a ground connection. The semiconductor body serving as the collector of the transistor further comprises an epitaxial layer. The semiconductor body also further comprises a sink for electrons.

In still another aspect of the present invention, the semiconductor body of the first conductivity type comprises an N-type material, and the doped region of second conductivity type comprises a P-type material.

In a method aspect of the invention, a transistor is formed for protecting against electrostatic discharge. A semiconductor body of a first conductivity is formed to serve as the collector of the transistor. A first doped region of a second conductivity is then formed in the semiconductor body to serve as the base of the transistor and form a collector-to-base junction with semiconductor body. A second doped region of the first conductivity type is formed in the first doped region to serve as the emitter of the transistor and form a base-to-emitter junction with the first doped region and second conductivity type.

The first doped region is further formed by forming a generally H-shaped doped region and then forming a generally ring-shaped doped region and forming an opening in which the second doped region serving as the emitter is received. This H-shaped doped region is formed with a deeper junction surface than said ring-shaped doped region and a dopant concentration that is less than the dopant concentration of the ring-shaped doped region so that when the first and second doped regions are connected, the H-shaped doped region achieves a low collector-to-base breakdown voltage, and the ring-shaped doped region achieves a low snap-back voltage when the transistor is placed in the circuit subject to electrostatic discharge.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

Figure 1:
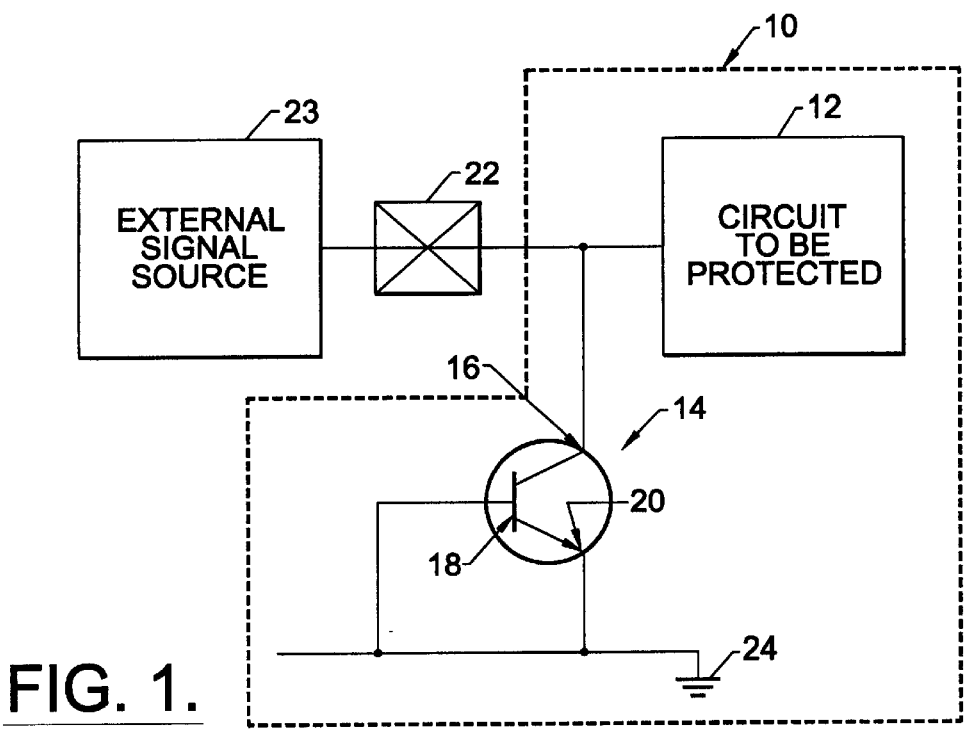
FIG. 1 is a schematic diagram of the protection circuit of the present invention.

The present invention now provides an electrostatic discharge (ESD) protection circuit, illustrated by the dotted line configuration at 10 in FIG. 1, which protects another circuit, such as another semiconductor circuit 12, against an electrostatic discharge occurring through contact with human beings or other sources of static electricity. Typically, the circuit 10 is formed on a single semiconductor substrate material as is known to those skilled in the art. The present invention uses a unique bipolar transistor illustrated generally at 14 having a collector, base and emitter, 16, 18, 20. The collector 16 is formed from a doped region of a first conductivity. The base 18 and emitter 20 are connected together. The base 18 comprises a unique first doped region of second conductivity having a generally H-shaped doped region and a generally ring-shaped doped region forming an open area to receive a second doped region of the first conductivity serving as the emitter. The H-shaped doped region has a deeper junction depth than the ring-shaped doped region and a dopant concentration that is less than the dopant concentration of the ring-shaped doped region so that the H-shaped doped region achieves a low collector-to-base breakdown voltage, and the ring-shaped doped region achieves a low snap-back voltage.

Figure 2:
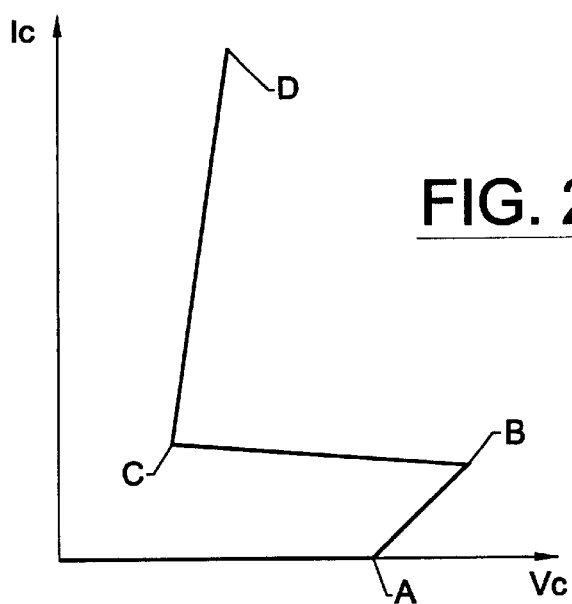
FIG. 2 is a characteristic curve for the bipolar transistor of the present invention.

FIG. 2 illustrates a characteristic curve of the transistor used in the circuit 10 of the present invention circuit for protecting against electrostatic discharge. The base line on the curve is labeled Vc, indicating the voltage between the collector and the emitter. The vertical line is labeled Ic, and indicates the generated current of the collector 16 versus the applied voltage. The characteristic curve indicates that at a voltage point labeled A, corresponding to the avalanche breakdown point, the current across the collector increases while the voltage also slightly increases until point B is reached. At this point, the voltage then snaps back to the snap back point located at point C. At this time, the transistor 14 exhibits very low resistance and the current increases with only a slight increase in voltage as shown by the elevated line labeled D.

Referring once again to FIG. 1, the ESD circuit protection 10 of the present invention is illustrated in the schematic diagram. A pad 22 is connected to an external signal source 23, which could be a power source or other signal source. The collector 16 of the transistor 14 is connected to the pad 22 and the base 18 and emitter 20 of the transistor 14 are connected to each other and connected to the ground 24.

Figure 3:
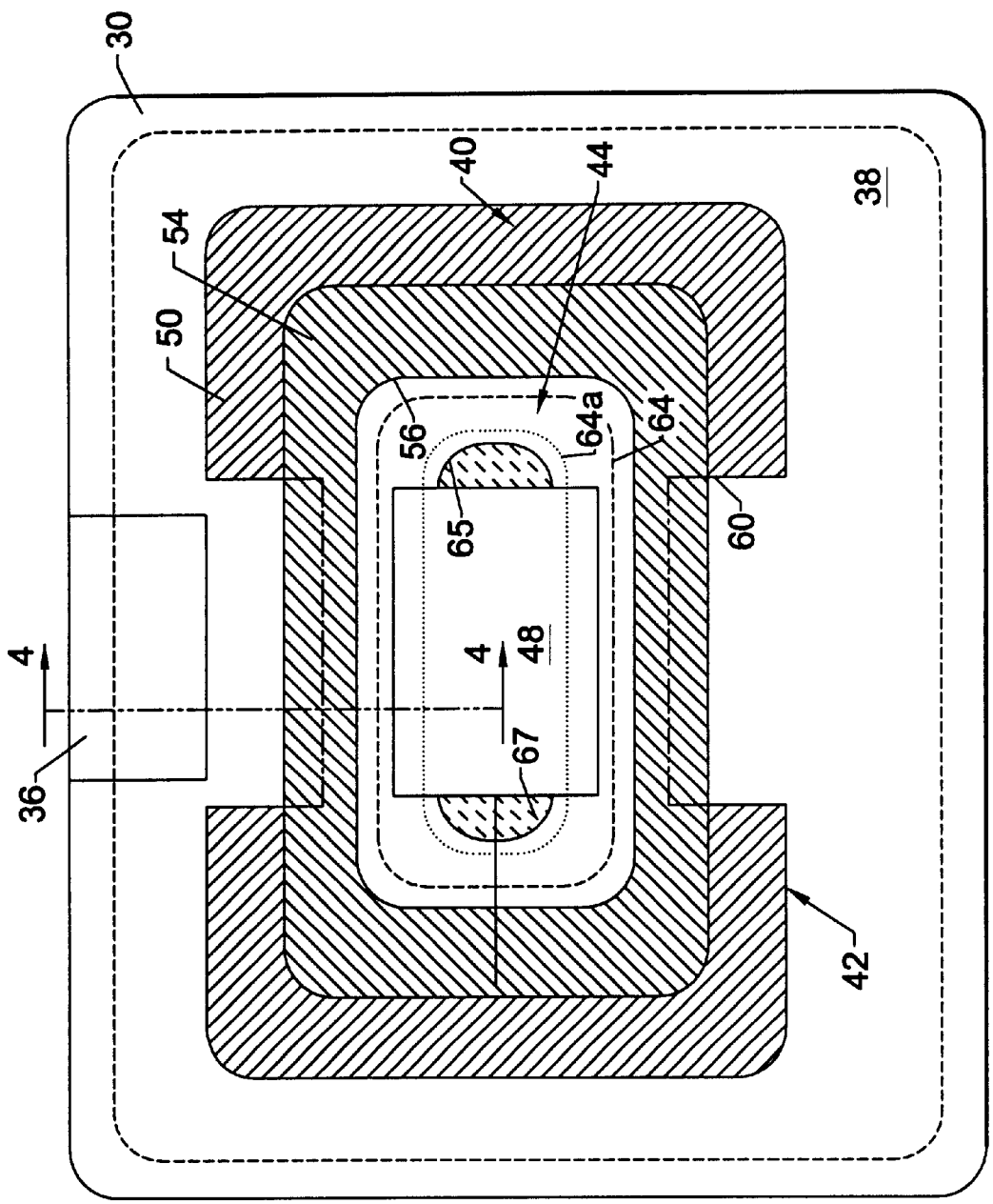
FIG. 3 is a top plan view of the transistor used in the protection circuit of the present invention.
Figure 4:
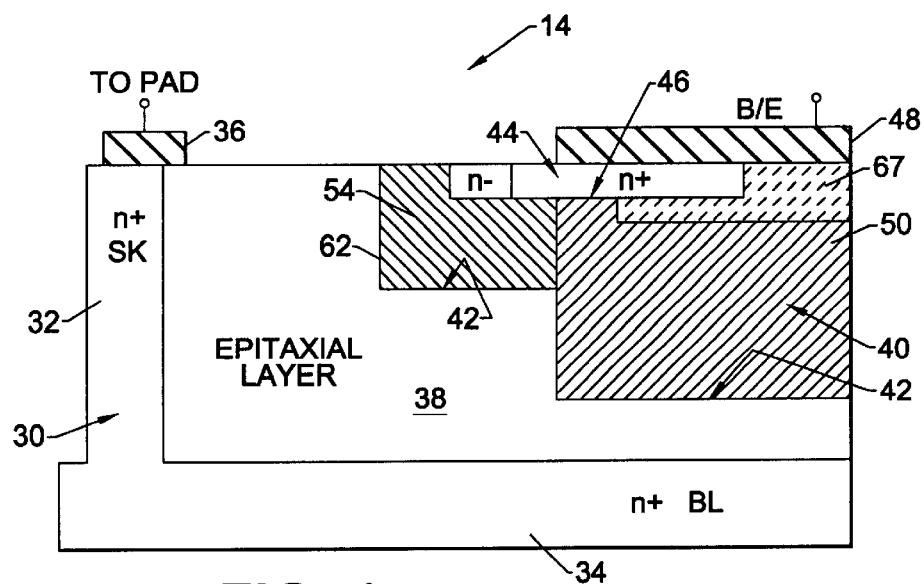
FIG. 4 is an exaggerated sectional view of the transistor of FIG. 3 taken along line 4—4.

Referring now to FIGS. 3 and 4, greater details of the transistor 14 and circuit 10 are shown. A semiconductor body of a first conductivity type is generally shown at 30, and serves as the collector 16 of the transistor 14. Typically, it is formed as part of a larger semiconductor substrate or similar body where many semiconductor components are formed as known to those skilled in the art. In one aspect of the present invention, the semiconductor body 30 of the first conductivity type is formed from an N-type material and includes a sink portion 32 and a bulk portion 34. As shown in the exaggerated sectional view of FIG. 4, where horizontal distances are exaggerated to show relation among various transistor 14 components, a collector contact 36 is positioned at the top portion of the semiconductor body 30 and serves as the electrical contact point, which can be connected to the pad 22. The sink portion 32 supplies the charge carriers (holes or electrons) to the device as conventionally known to those skilled in the art.

An epitaxial layer 38 is formed on the semiconductor body 30 (or substrate) and has a lattice structure generally similar to that of the semiconductor body and formed by techniques known to those skilled in the art such as vapor phase epitaxial layer.

A first doped region, indicated generally at 40, of a second conductivity type is contained in the semiconductor body 30 and serves as the base 18 of the transistor and forms a collector-to-base junction 42 with the semiconductor body. In the illustrated embodiment, this first doped region 40 is formed with a P-type impurity, forming a NPN bipolar transistor. It should be understood as known to those skilled in the art that the transistor can also be formed as a PNP transistor. In that instance, the semiconductor body 30 would be doped with a P-type material. A second doped region 44 of the first conductivity type (N-type doped region) is contained in the first doped region 40 and serves as the emitter 20 of the transistor 14 and forms a base-to-emitter junction 46 with the first doped region 40. Shorted connection means connect together the base 18 and emitter 20 formed by first and second doped regions 40, 44, and as illustrated in FIG. 3, are connected together by a single contact 48, which can be connected to ground 24.

Figure 5:
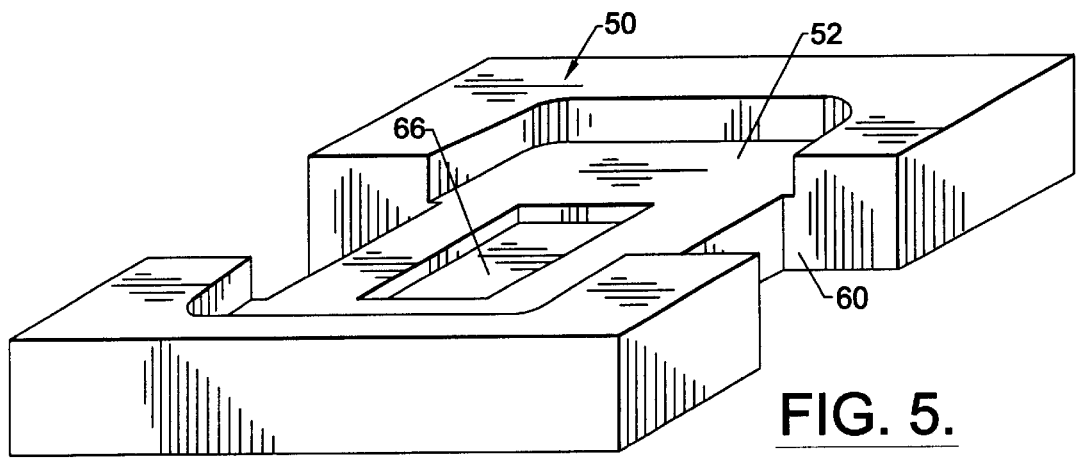
FIG. 5 is an isometric view of the H-shaped doped region of the gate, showing the region where the ring-shaped doped region is received and substantially encircled.

As shown in FIGS. 3, 4 and 5, the first doped region of second conductivity type includes an H-shaped doped region 50 (shown by angled section lines sloping downward to the left), which includes a ring-shaped recess 52 that receives a ring-shaped doped region 54 (shown by angled section lines sloping downward to the right). As shown in FIG. 4, the H-shaped doped region 50 has a deeper junction 42 depth than the depth of the ring-shaped doped region. The dopant concentration of the H-shaped doped region is also less than the dopant concentration of the ring-shaped doped region 54. The H-shaped doped region further comprises an inward formed medial section 60 forming the cross-piece of an H, which exposes a portion of the ring-shaped doped region 54 to the semiconductor body serving as the collector 16. The medial section 60 intersects the recess so that a side edge 62 of the ring-shaped doped region is exposed. This exposed portion of the ring-shaped doped region is illustrated in FIG. 4. FIG. 3 illustrates a plan view showing the basic configuration of the H-shaped doped region, its recess 52, and the ring-shaped doped region received in recess 52.

The second doped region 44 of the first conductivity type is contained in the first doped region 40 and serves as the emitter of the transistor 14 and forms the base-to-emitter junction 46 with the first doped region 40. This second doped region 44 serving as the emitter 20 is also generally ring-shaped and received within the area formed by the opening 56. This opening is generally oval configured and defined in its interior by the dashed line 64 in FIG. 3 and exposes a portion of the H-shaped doped region underlying this area to this second doped region 44 serving as the emitter 20. The ring-shaped emitter also forms an opening 65. As better shown in FIG. 5, the H-shaped doped region includes a central slot 66 formed in the ring-shaped recess 52 and includes an upper doped region 67 (shown by dashed, downward sloping lines) of second conductivity (P-type material) received in the central slot and engaging the pad to form an upper part of the transistor base 18. This P-type material is formed as a generally elongate layer of material that is received within the central slot 66 of the H-shaped doped region 50 and exposed to the contact 48 through the oval opening 65 formed by the ring-shaped second doped region of the emitter. The dotted line 64a in FIG. 3 corresponds to the periphery of the upper portion of the base formed by the upper doped region 67 having the P-type material engaging the emitter and contact.

Because of these two differences in the dopant concentration, the breakdown region of the transistor is confined within the ring-shaped doped region 54 that is not covered by the H-shaped doped region, i.e., that portion such as the side edge 62, which is exposed to the collector 16. This area forms a planar region whose junction is fairly deep and rugged to the electrostatic discharge event. Because of the high dopant concentration of this ring-shaped doped region, the breakdown voltage of the base/collector junction 42 is low.

In the snap-back operation, the transistor action is mostly vertical. The opening 56 formed in the ring-shaped doped region confines the transistor effect within that H-shaped doped region 50 of the base 18 not covered (i.e., exposed) by the ring-shaped doped region, and thus, conductive with the emitter. This structure enhances the transistor current gain and lowers the snap-back voltage of the formed transistor. Thus, if the failure threshold of the transistor is associated with electrical power, which is dissipated within the snap-back region, the circuit of the present invention greatly enhances the failure threshold of the transistor at no detriment to clamping efficiency. The circuit allows a much lower snap-back voltage than it would be possible to achieve with the conventional, low breakdown base doping profile. The combined layout of the two doping profiles of the base is, therefore, advantageous.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed and that the modifications and embodiments are intended to be included within the scope of the intended claims.

That which is claimed is:

1. A method for forming transistor for protecting against electrostatic discharge comprising the steps of:

forming a semiconductor body of a first conductivity type to serve as a collector of the transistor;

forming a first doped region of a second conductivity type in the semiconductor body to serve as a base of the transistor and form a collector-to-base junction with the semiconductor body;

forming a second doped region of the first conductivity type in the first doped region to serve as an emitter of the transistor and form a base-to-emitter junction with the first doped region of second conductivity type;

said method of forming the first doped region further comprising the steps of:

forming a generally H-shaped doped region, and forming a generally ring-shaped doped region and forming an opening in which the second doped region serving as the emitter is received, and forming the opening to expose a portion of the H-shaped doped region to the second doped region serving as the emitter, wherein said H-shaped doped region is formed to have a deeper junction depth than the ring-shaped doped region and a dopant concentration that is less than a dopant concentration of the ring-shaped doped region so that when the first and second doped regions are connected, the H-shaped doped region achieves a low collector-to-base breakdown voltage and the ring-shaped doped region achieves a low snap-back voltage when the transistor is placed in a circuit subject to electrostatic discharge.

2. The method according to claim 1 including the step of connecting together both first and second doped regions serving as the base and emitter.

3. The method according to claim 1 including the step of forming an epitaxial layer.

4. A method according to claim 1, and further comprising the step of forming the H-shaped doped region such that the H-shaped doped region receives and substantially encircles the ring-shaped doped region.

5. A method according to claim 4, and further comprising the step of forming a recess that receives the ring-shaped doped region.

6. A method according to claim 1, and further comprising the step of forming an inward formed medial section that exposes a portion of the ring-shaped doped region to the semiconductor body serving as the collector.

7. A method according to claim 2, and further comprising the step of forming the H-shaped doped region that is exposed by the opening to define a central slot, and further comprising the step of forming a doped region of second conductivity received in the central slot and engaging a connection of first and second doped regions.

8. A method according to claim 2, and further comprising the step of forming a connection between first and second doped regions as a ground connection.

9. A method for forming a circuit for protecting against electrostatic discharge comprising the steps of:

forming a semiconductor body of a first conductivity type to serve as a collector of the transistor;

forming a first doped region of a second conductivity type in the semiconductor body to serve as a base of the transistor and form a collector-to-base junction with the semiconductor body;

forming a second doped region of the first conductivity type in the first doped region to serve as an emitter of the transistor and form a base-to-emitter junction with the first doped region of second conductivity type;

said method of forming the first doped region further comprising the steps of:

forming a generally H-shaped doped region, and forming a generally ring-shaped doped region and forming an opening in which the second doped region serving as the emitter is received, and forming the opening to expose a portion of the H-shaped doped region to the second doped region serving as the emitter, wherein said H-shaped doped region is formed to have a deeper junction depth than the ring-shaped doped region and a dopant concentration that is less than a dopant concentration of the ring-shaped doped region so that when the first and second doped regions are connected, the H-shaped doped region achieves a low collector-to-base breakdown voltage and the ring-shaped doped region achieves a low snap-back voltage when the transistor is placed in a circuit subject to electrostatic discharge;

connecting the collector of the transistor to a pad; and connecting the pad to a circuit to be protected against electrostatic discharge.

10. The method according to claim 9, including the step of connecting together both first and second doped regions serving as the base and emitter.

11. The method according to claim 9, including the step of forming an epitaxial layer.

12. A method according to claim 9, and further comprising the step of forming the H-shaped doped region such that the H-shaped doped region receives and substantially encircles the ring-shaped doped region.

13. A method according to claim 9, and further comprising the step of forming a recess that receives the ring-shaped doped region.

14. A method according to claim 9, and further comprising the step of forming an inward formed medial section that exposes a portion of the ring-shaped doped region the semiconductor body serving as the collector.

15. A method according to claim 10, and further comprising the step of forming the H-shaped doped region that is exposed by the opening to define a central slot, and further comprising the step of forming a doped region of second conductivity received in the central slot and engaging a connection of first and second doped regions.

16. A method according to claim 10, and further comprising the step of forming a connection between first and second doped regions as a ground connection.

* * * * *